US007745734B2

(12) United States Patent
Isebo

(10) Patent No.: US 7,745,734 B2
(45) Date of Patent: Jun. 29, 2010

(54) CERAMIC MULTILAYER SUBSTRATE

(75) Inventor: Kazuhiro Isebo, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 421 days.

(21) Appl. No.: 11/738,637

(22) Filed: Apr. 23, 2007

(65) Prior Publication Data

US 2007/0187137 A1   Aug. 16, 2007

Related U.S. Application Data

(63) Continuation of application No. PCT/JP2006/307590, filed on Apr. 10, 2006.

(30) Foreign Application Priority Data

May 12, 2005   (JP)   ............................. 2005-140442

(51) Int. Cl.
*H05K 1/03*   (2006.01)
(52) U.S. Cl. ........................ 174/255; 174/258; 361/761
(58) Field of Classification Search ......... 361/761–764; 174/255, 256, 258
See application file for complete search history.

(56) References Cited

U.S. PATENT DOCUMENTS

| 5,599,747 | A | * | 2/1997 | Bhatt et al. ................. 29/832 |
| 5,600,541 | A | * | 2/1997 | Bone et al. ................. 361/707 |
| 6,743,316 | B2 | | 6/2004 | Harada et al. |

FOREIGN PATENT DOCUMENTS

| JP | 05-243700 A | 9/1993 |
| JP | 06-252558 A | 9/1994 |
| JP | 10-173083 A | 6/1998 |
| JP | 10-189810 A | 7/1998 |
| JP | 10-289964 A | 10/1998 |
| JP | 2001-284808 A | 10/2001 |
| JP | 2002-026528 A | 1/2002 |
| JP | 2002-164654 A | 6/2002 |
| JP | 2003-060106 A | 2/2003 |
| JP | 2003-224222 A | 8/2003 |
| JP | 2004-071852 A | 3/2004 |
| JP | 2004-095767 A | 3/2004 |
| JP | 2004-165247 A | 6/2004 |
| JP | 2006-019643 A | 1/2006 |
| JP | 2006-041345 A | 2/2006 |

(Continued)

OTHER PUBLICATIONS

Official Communication for PCT Application No. PCT/JP2006/307590; mailed on Jul. 4, 2006.

(Continued)

*Primary Examiner*—Jeremy C Norris
(74) *Attorney, Agent, or Firm*—Keating & Bennett, LLP

(57) ABSTRACT

A ceramic multilayer substrate includes a plurality of laminated ceramic layers and at least one conductor pattern and disposed on at least one of the ceramic layers. The ceramic multilayer substrate has a cavity in at least a first main surface. The ceramic multilayer substrate includes a deformation preventing pattern disposed on at least one of the ceramic layers having an opening forming the cavity. The deformation preventing pattern surrounds the entire perimeter of the opening and is made of the same material as the conductor pattern.

13 Claims, 6 Drawing Sheets

FOREIGN PATENT DOCUMENTS

WO 81/00949 A1 4/1981
WO 87/01510 A1 3/1987

OTHER PUBLICATIONS

Official communication issued in counterpart Korean Application No. 10-2007-7004345, mailed on May 29, 2008.

Official Communication issued in counterpart European Application No. 06731537.4, mailed on Jun. 29, 2009.

Official Communication issued in counterpart Japanese Application No. P2006-529412, mailed on Jul. 16, 2009.

* cited by examiner

CERAMIC MULTILAYER SUBSTRATE

BACKGROUND OF THE INVENTION

1. Field of the Invention

The present invention relates to a ceramic multilayer substrate, and more particularly, to a ceramic multilayer substrate having a cavity.

2. Description of the Related Art

A ceramic multilayer substrate having a cavity structure has been used to increase the packaging density and to reduce the size and the profile of an electronic component.

A ceramic multilayer substrate having a cavity is formed by stacking a green ceramic layer having no opening and a green ceramic layer having an opening and firing them to form a cavity. In a ceramic multilayer substrate having a cavity, differences in the shrinkage of ceramic layers during firing tend to cause cracks at a bottom end of the cavity and deformation, such as warp or waviness, at a portion forming the bottom of the cavity or a side wall on the perimeter of the cavity. Various techniques have been proposed to prevent such failures.

For example, Japanese Unexamined Patent Application Publication No. 2003-60106 (Patent Document 1) discloses providing an interposing layer at a portion forming a side wall on the perimeter of a cavity. The interposing layer has a smaller shrinkage than the ceramic layers during firing. Japanese Unexamined Patent Application Publication No. 2002-164654 (Patent Document 2) discloses providing a stress relieving pad, which reduces a contraction stress generated at an interface between ceramic layers, in the vicinity of a bottom end of the internal surface of a cavity. Japanese Unexamined Patent Application Publication No. 2004-165247 (Patent Document 3) discloses embedding a pattern for retaining the shape, which is formed of a ceramic material having a minimum sintering temperature greater than that of a ceramic material for a green sheet for forming a substrate, along the vicinity of the corners of a cavity in a ceramic multilayer substrate.

Furthermore, Japanese Unexamined Patent Application Publication No. 10-173083 (Patent Document 4) discloses a cavity having a step that is deeper in the center than in the periphery of the cavity.

Furthermore, Japanese Unexamined Patent Application Publication No. 5-243700 (Patent Document 5) and Japanese Unexamined Patent Application Publication No. 2002-26528 (Patent Document 6) disclose lowering the minimum sintering temperature of a conductive paste for an internal electrode below the minimum sintering temperature of a ceramic green sheet.

When an interposing layer is provided to control the shrinkage of a ceramic layer during firing, a circuit provided in a ceramic multilayer substrate is subjected to stricter design restrictions depending on the position of the interposing layer. In addition, because the interposing layer differs in characteristics or shape from a ceramic green sheet forming a major portion of a substrate, an additional specific process is needed. Hence, it is difficult to reduce the manufacturing costs.

Similarly, since a stress relieving pad or a pattern for retaining the shape must have a specific shape or characteristic, it requires another specific process. Thus, it is difficult to reduce the manufacturing costs.

SUMMARY OF THE INVENTION

To overcome the problems described above, preferred embodiments of the present invention provide a ceramic multilayer substrate in which non-uniform deformation is prevented without the addition of a specific process.

A preferred embodiment of the present invention provides a ceramic multilayer substrate having the following structure to overcome the above-identified problems.

A ceramic multilayer substrate includes a plurality of ceramic layers laminated together and at least one conductor pattern disposed on at least one of the plurality of ceramic layers. The ceramic multilayer substrate has a cavity in at least a first main surface. At least one of the plurality of ceramic layers having an opening defining the cavity includes a deformation preventing pattern. The deformation preventing pattern is arranged to surround substantially an entire perimeter of the opening when viewed in a direction that is substantially perpendicular to the first main surface and is made of the same material as the conductor pattern.

With this configuration, the conductor pattern defines a portion of an electric circuit. Specifically, the conductor pattern defines a portion of a built-in circuit in the ceramic multilayer substrate, for example, an internal electrode pattern, such as a capacitor pattern, an inductor pattern, a ground pattern, or a wiring pattern for interconnection, or a surface terminal pattern in the ceramic multilayer substrate. The deformation preventing pattern may be just a dummy pattern, which is independent of an electric circuit, or may also function as a conductor pattern.

In the preferred embodiment described above, the deformation preventing pattern is arranged to surround the entire perimeter of the opening, and therefore, prevents a ceramic layer from being non-uniformly deformed during firing. The deformation preventing pattern more effectively prevents the deformation, as compared to when the deformation preventing pattern is provided on only part of a portion surrounding the opening.

The deformation preventing pattern is made of the same material as the conductor pattern and can therefore be formed by the same process as the conductor pattern. Hence, an additional specific process is not required.

Preferably, the deformation preventing pattern includes an annular pattern surrounding substantially the entire perimeter of the opening.

The deformation of a ceramic layer having an opening is therefore effectively prevented.

Preferably, the deformation preventing pattern includes a partitioned pattern in which a plurality of pattern elements is arranged at intervals on at least one of the ceramic layers having the opening, so as to surround substantially the entire perimeter of the opening.

According to the structure described above, an appropriately partitioned pattern depending on the degree of deformation of a ceramic layer having an opening can be provided to prevent the deformation of the ceramic layer having an opening during firing.

Preferably, the opening is substantially rectangular. The deformation preventing pattern includes a belt-like pattern on at least one of the ceramic layers having the opening. The belt-like pattern extends along at least one side of the opening.

According to the structure described above, an appropriately shaped belt-like pattern depending on the degree of deformation of a ceramic layer having an opening can be provided to prevent the deformation of the ceramic layer having an opening during firing.

The term "deformation preventing pattern" used herein refers to a pattern for preventing deformation during the formation of a cavity or during firing. This pattern for preventing deformation includes at least one of an in-plane conductor pattern and an interlayer connection conductor pattern, and may be a ground pattern having a ground potential, or may be a signal pattern for transmitting electric signals. Alternatively, the deformation preventing pattern may be a dummy pattern, which is not connected to a ground pattern or a signal pattern.

Furthermore, the deformation preventing pattern may be any combination of the annular pattern, the partitioned pattern, and the belt-like pattern disposed on a ceramic layer having an opening. In addition, the shape and dimensions of each pattern may be determined based on the degree of deformation of the ceramic layer having an opening. Furthermore, the deformation preventing pattern is not necessarily provided on one ceramic layer having an opening defining a cavity. For example, a plurality of deformation preventing patterns disposed on at least two different ceramic layers may be arranged to surround the entire perimeter of the cavity when viewed from a main surface of the ceramic multilayer substrate. Furthermore, the number of deformation preventing patterns that are provided transversely or longitudinally in the ceramic multilayer substrate may vary based on the degree of deformation. For example, when viewed perspectively, three layers of transverse deformation preventing patterns and one layer of longitudinal deformation preventing pattern may be provided.

Preferably, the opening of the cavity is substantially square. The first main surface is preferably substantially rectangular including long sides and short sides. The first main surface includes a conductor pattern other than the deformation preventing pattern and the at least one deformation preventing pattern, each disposed between the opening of the cavity and the short sides of the first main surface. The at least one deformation preventing pattern has an area greater than the remaining conductor pattern.

When the first main surface is substantially rectangular, shrinkage at firing along the long sides of the first main surface is greater than shrinkage at firing along the short sides of the first main surface. Thus, a cavity surrounding portion tends to deform. A large deformation preventing pattern disposed on the first main surface prevents the deformation of the cavity surrounding portion.

Preferably, the deformation preventing pattern is disposed on the first main surface.

According to the structure described above, the deformation preventing pattern can be easily formed in the same manner as a terminal electrode of a conductor pattern disposed on the first main surface. Furthermore, the amount of deformation prevention of a ceramic layer having an opening can be easily adjusted.

Preferably, a ceramic multilayer substrate according to another preferred embodiment of the present invention includes a plurality of the deformation preventing patterns and an interlayer connection conductor pattern. The plurality of the deformation preventing patterns is disposed on each main surface of the plurality of ceramic layers having the opening. The interlayer connection conductor pattern is preferably made of the same material as the conductor pattern, passes through the ceramic layers, and is connected to the plurality of the deformation preventing patterns.

According to the structure described above, the connection of a plurality of deformation preventing patterns with the interlayer connection conductor pattern increases the rigidity and thereby increases the ability to prevent the deformation. Furthermore, a plurality of deformation preventing patterns can be maintained at the same electrical potential.

Preferably, a ceramic multilayer substrate according to another preferred embodiment of the present invention includes a plurality of the interlayer connection conductor patterns. The plurality of interlayer connection conductor patterns is alternately disposed in at least two substantially parallel lines when viewed in the direction that is substantially perpendicular to the first main surface.

In this case, when a plurality of interlayer connection conductor patterns is arranged in a zigzag or staggered arrangement, the magnetic shielding of a component provided in the cavity is improved.

Preferably, the deformation preventing pattern includes a ground pattern electrically connected to a portion having a ground potential in the conductor pattern.

According to the structure described above, the deformation preventing pattern functioning as a ground pattern has a ground potential and therefore also acts as an electromagnetic shield of an electrical component (particularly, an IC chip) provided in the cavity. In particular, when deformation preventing patterns disposed on different main surfaces of a ceramic layer having an opening are connected to each other via an interlayer connection conductor pattern passing through the ceramic layer, the ground potential is stabilized to a greater extent.

Preferably, the ceramic multilayer substrate includes a terminal disposed on the first main surface. The terminal connects the ceramic multilayer substrate to a circuit board.

According to the structure described above, the ceramic multilayer substrate has a "down cavity structure," in which the cavity faces a circuit board (hereinafter referred to as "motherboard"). In the down cavity structure, a first main surface on a cavity side is connected to a motherboard. Thus, it is particularly important to prevent the deformation of a ceramic layer having an opening to ensure the connection reliability between the ceramic multilayer substrate and the motherboard. Furthermore, as described above, when a deformation preventing pattern is connected to a portion having a ground potential in a conductor pattern, the deformation preventing pattern functioning as a ground pattern in the down cavity structure approaches the motherboard. Thus, the ground pattern can approach so-called "ideal ground." This enables grounding enhancement of the ceramic multilayer substrate, which in turn improves high-frequency characteristics.

Preferably, a first surface mountable device is mounted in the cavity provided in the first main surface. A second surface mountable device is mounted to a second main surface opposite to the first main surface.

According to the structure described above, surface mountable devices, such as chip capacitors, chip LC filters, or semiconductor ICs, can be mounted on both surfaces of a ceramic multilayer substrate having a "down cavity structure." Thus, the ceramic multilayer substrate is smaller and has increased functionality.

Preferably, a ceramic multilayer substrate according to a preferred embodiment of the present invention includes a surface pattern arranged along the cavity on the first main surface. The surface pattern is made of the same material as the conductor pattern.

According to the structure described above, the surface pattern can be exposed at the first main surface of the ceramic multilayer substrate to improve the deformation prevention.

The surface pattern is not necessarily provided around the entire perimeter of the cavity. For example, when a terminal is arranged on a first main surface of a ceramic multilayer substrate, the surface pattern may be arranged on a vacant region having no terminal. In this case, the surface pattern preferably has an area greater than the terminal arranged on the first main surface. Preferably, the surface pattern is connected to a deformation preventing pattern having a ground potential (in particular, a plurality of deformation preventing patterns connected to each other via an interlayer connection conductor pattern), because the connection enhanced the grounding.

Preferably, the plurality of ceramic layers are made of a low temperature co-fired ceramic material. The conductor pattern and the deformation preventing pattern are preferably made of a material including silver or copper as a main component.

A low temperature co-fired ceramic (LTCC) material can be sintered at a firing temperature of about 1,050° C. or less and can be sintered together with silver (Ag) or copper (Cu), which has a low specific resistance. The low temperature co-fired ceramic (LTCC) material is therefore suitable for a ceramic multilayer substrate for use in high-frequency applications. Specific examples of a low temperature sintered ceramic material (hereinafter referred to as "LTCC material") include a glass composite LTCC material, which is a mixture of a ceramic powder, such as alumina or forsterite, and borosilicate glass, a crystallized glass LTCC material including $ZnO$—$MgO$—$Al_2O_3$—$SiO_2$ crystallized glass, and a non-glass LTCC material including a $BaO$—$Al_2O_3$—$SiO_2$ ceramic powder or an $Al_2O_3$—$CaO$—$SiO_2$—$MgO$—$B_2O_3$ ceramic powder.

In a ceramic multilayer substrate according to preferred embodiments of the present invention, non-uniform deformation is prevented without the addition of a particular process.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described below with reference to FIGS. 1 to 9.

First Preferred Embodiment

A ceramic multilayer substrate 10 according to a first preferred embodiment will be described below with reference to FIGS. 1 to 5.

Figure 1:
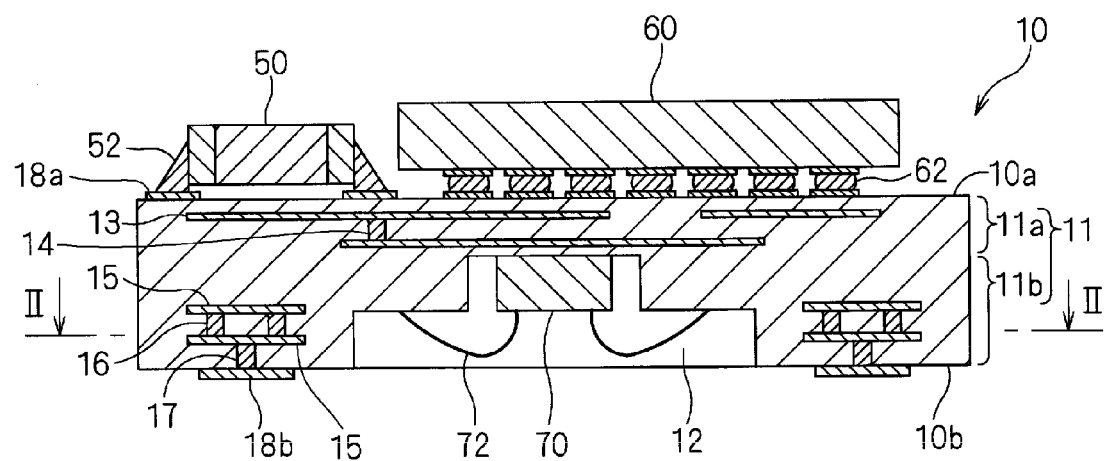
FIG. 1 is a cross-sectional view of a ceramic multilayer substrate according to a preferred embodiment of the present invention.

As illustrated in the cross-sectional view of FIG. 1, a main body 11 of the ceramic multilayer substrate 10 includes a planar base plate portion 11a and a cavity surrounding portion 11b which defines a cavity 12 disposed in the center of the main body 11. The ceramic multilayer substrate 10 is formed by stacking and firing a plurality of ceramic green sheet layers.

Within the main body 11, an in-plane conductor 13 disposed between ceramic green sheets, a via hole conductor 14 with which a through-hole (via) passing through the ceramic green sheets is filled, and other components define an internal electrode pattern, which defines a portion of a built-in circuit. Examples of the internal electrode pattern include a pattern of a passive element, such as a capacitor or an inductor, a ground pattern, and a wiring pattern for interconnection.

A second main surface 10a and a first main surface 10b of the ceramic multilayer substrate 10 include terminal electrodes 18a and 18b electrically connected to the built-in circuit. Furthermore, the cavity 12 has an opening in the first main surface 10b.

For example, the ceramic multilayer substrate 10 includes an IC chip 70 mounted in the cavity 12 with bonding wires 72 as a portion of the built-in circuit. Furthermore, for example, a chip multilayer ceramic capacitor 50 is mounted on the terminal electrodes 18a on the second main surface 10a with solder 52, and a semiconductor device 60 is mounted with solder balls 62.

The ceramic multilayer substrate 10 including surface mountable devices 50, 60, and 70 mounted on the second main surface 10a or in the cavity 12 is mounted on a large circuit board (motherboard), such as a printed circuit board, via the terminal electrodes 18b on the first main surface 10b.

Next, the features of the ceramic multilayer substrate 10 will be described below.

As illustrated in FIG. 1, a plurality of deformation preventing patterns 15 arranged between a plurality of ceramic layers, as well as the in-plane conductor 13, is disposed on the inside (bank) of the cavity surrounding portion 11b defining the cavity 12 in the main body 11 of the ceramic multilayer substrate 10. Furthermore, the deformation preventing patterns 15 are connected to each other via an interlayer connection conductor pattern 16 passing through the ceramic layers, as well as the via hole conductor 14. One or at least two deformation preventing patterns 15 may be arranged without the interlayer connection conductor pattern 16.

The deformation preventing patterns 15 substantially surround the entire perimeter of the cavity 12 and prevent the deformation of the main body 11, particularly deformation of the cavity surrounding portion 11b, during firing of the ceramic multilayer substrate 10. A plurality of deformation preventing patterns 15 more effectively prevents the deformation (in particular, warp) of the cavity surrounding portion 11b. In addition, connecting a plurality of deformation preventing patterns 15 with each other via the interlayer connection conductor pattern 16 increases the rigidity and restrains the deformation preventing patterns 15 from being out of alignment during firing. Thus, this increases the ability to prevent the deformation.

The deformation preventing patterns 15 are electrically connected via a connection conductor 17 to a portion that is to have a ground potential in the built-in circuit of the ceramic multilayer substrate 10, for example, the terminal electrodes 18b, which are to be connected to ground terminals of the motherboard.

Thus, the deformation preventing patterns 15 surrounding the cavity 12 have a ground potential, and therefore, also act as an electromagnetic shield of a component 70 disposed in the cavity 12. When a plurality of deformation preventing patterns 15 has a ground potential, the ground potential is further stabilized. Furthermore, a plurality of deformation preventing patterns 15 provided on different layers is connected to each other via a plurality of interlayer connection conductor patterns. This enhances the magnetic shielding. A deformation preventing pattern may be a floating pattern (dummy pattern), which is not connected to the built-in circuit.

The ceramic multilayer substrate 10 has a "down cavity structure," in which the opening of the cavity 12 faces the motherboard. In the down cavity structure, the main surface 10b on the cavity 12 side is connected to the motherboard and therefore requires outstanding flatness. Thus, it is particularly important to prevent the deformation of the cavity surrounding portion 11b. In particular, as described above, when the deformation preventing patterns 15 have a ground potential, the deformation preventing patterns in the down cavity structure are arranged close to the motherboard. Accordingly, the ground pattern can approach so-called "ideal ground." This provides improved grounding, which in turn improves high-frequency characteristics.

Figure 2:
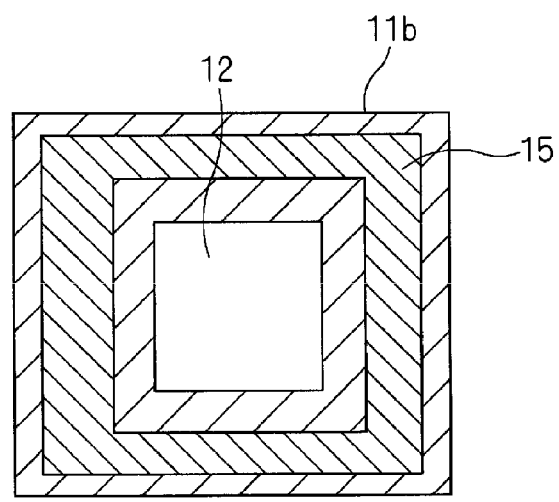
FIG. 2 is a cross-sectional view of a deformation preventing pattern in the ceramic multilayer substrate.

As illustrated in FIG. 2, which is a cross-sectional view taken along line II-II of FIG. 1, the deformation preventing patterns 15 have an annular pattern surrounding the entire perimeter of the cavity 12. The deformation preventing patterns 15 of an annular pattern more effectively prevent the deformation of the cavity surrounding portion 11b.

Figure 3:
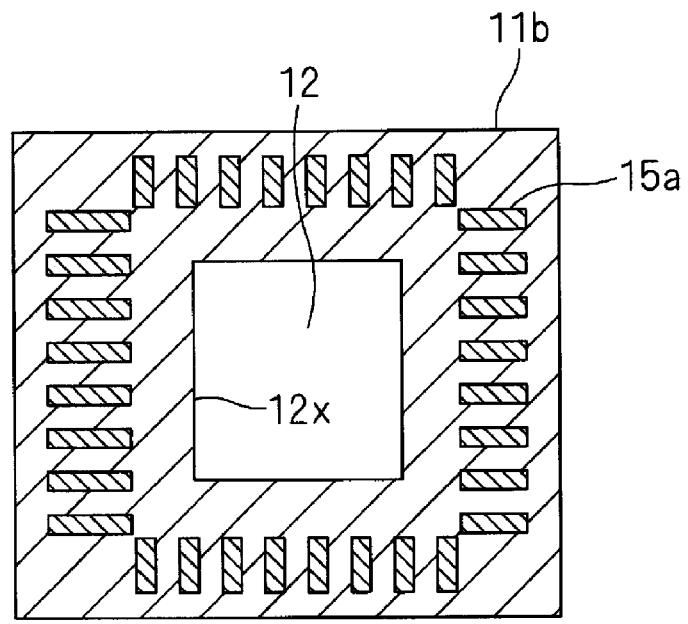
FIG. 3 is a cross-sectional view of another deformation preventing pattern.

In place of the annular pattern illustrated in FIG. 2, a partitioned pattern in which a plurality of pattern elements is arranged at intervals to surround the entire perimeter of the cavity 12 may be provided, such as the deformation preventing pattern 15a illustrated in FIG. 3. In this case, the shape, the size, and the arrangement of the pattern elements of the partitioned pattern can be appropriately determined by the degree of deformation of the cavity surrounding portion 11b to prevent the deformation of the cavity surrounding portion 11b.

Figure 4:
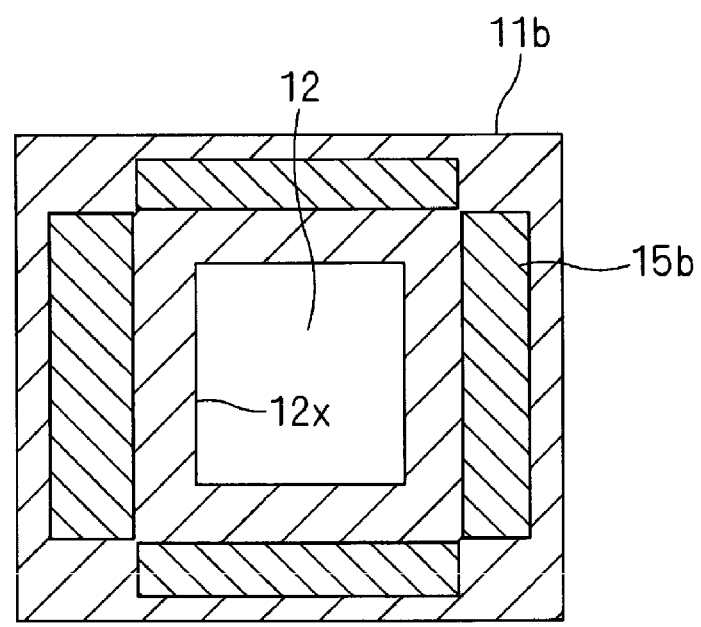
FIG. 4 is a cross-sectional view of still another deformation preventing pattern.

Furthermore, like deformation preventing patterns 15b illustrated in FIG. 4, belt-like patterns extending along the sides 12x of the substantially rectangular opening of the cavity 12 may be formed. In this case, the belt-like patterns having appropriate dimensions and an appropriate shape can be arranged at appropriate positions according to the degree of deformation of the cavity surrounding portion 11b to prevent the deformation of the cavity surrounding portion 11b. Furthermore, the belt-like patterns 15b along the sides 12x may be separated from each other or the adjacent belt-like patterns 15b may be combined. Furthermore, each belt-like pattern may not only be entirely parallel to the corresponding side 12x of the cavity 12 but may also be partially parallel to the corresponding side 12x.

Figure 5:
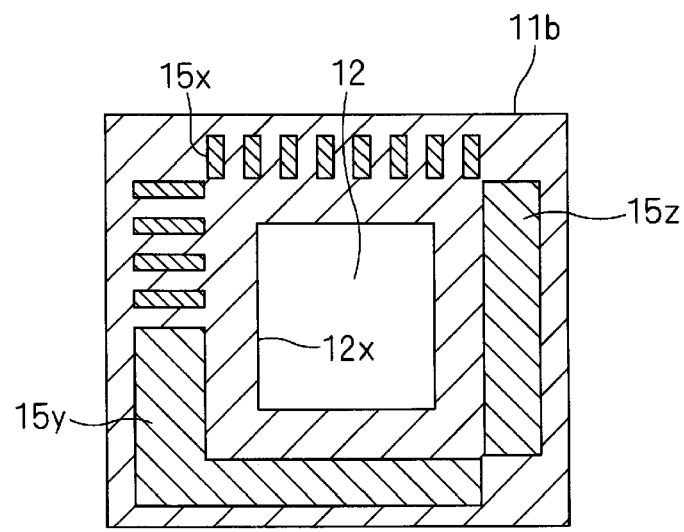
FIG. 5 is a cross-sectional view of another deformation preventing pattern.

In addition, the deformation preventing pattern may be an appropriate combination of the annular pattern, the partitioned pattern, and the belt-like pattern. In this case, the dimensions, the shape, and the arrangement of each pattern can be appropriately determined by the degree of deformation of the cavity surrounding portion 11b to prevent the deformation of the cavity surrounding portion 11b. For example, as illustrated in FIG. 5, a partitioned pattern 15x and belt-like patterns 15y and 15z are arranged to surround the entire perimeter of the cavity 12.

Next, a method for manufacturing the ceramic multilayer substrate 10 will be described below.

First, a plurality of ceramic green sheets for a substrate and auxiliary ceramic green sheets are prepared.

The ceramic green sheets for a substrate are unsintered glass-ceramic green sheets formed by molding a slurry including glass-ceramic by a doctor blade method or a casting method into a sheet. A low temperature co-fired ceramic (LTCC) material that can be sintered at a firing temperature of about 1050° C. or less is used for the ceramic green sheets for a substrate. The low temperature co-fired ceramic (LTCC) material can be sintered with silver (Ag) or copper (Cu), which has a low specific resistance, and is therefore suitable for a ceramic multilayer substrate for use in high-frequency applications. Specific examples of a low temperature co-fired ceramic (hereinafter referred to as "LTCC material") include a glass composite LTCC material, which is a mixture of a ceramic powder, such as alumina or forsterite, and borosilicate glass, a crystallized glass LTCC material including $ZnO$—$MgO$—$Al_2O_3$—$SiO_2$ crystallized glass, and a non-glass LTCC material including a $BaO$—$Al_2O_3$—$SiO_2$ ceramic powder or an $Al_2O_3$—$CaO$—$SiO_2$—$MgO$—$B_2O_3$ ceramic powder.

The through-holes for the via hole conductor 14, the interlayer connection conductor pattern 16 and the connection conductor 17, and the opening for the cavity 12 are formed in the ceramic green sheets for a substrate by methods for forming through holes, such as by using a metal mold, by drilling, by laser beam machining, or by other methods for forming through holes. The through-holes are filled with a conductive paste by printing method or other suitable methods, to form the via hole conductor 14, the interlayer connection conductor pattern 16, and the connection conductor 17. The conductive paste includes at least one metal component selected from the group consisting of Cu, Ag, Pd, W, and Au and a resin component. Preferably, the conductive paste includes Ag or Cu as a main component.

Furthermore, the in-plane conductor 13 and the deformation preventing patterns 15 may be formed on one main surface of a ceramic green sheet for a substrate by printing a conductive paste, for example, by screen printing or gravure printing, or transferring a metallic foil having a predetermined pattern. This conductive paste is made of the same materials as the conductive paste with which the through-holes for the via hole conductor 14, the interlayer connection conductor pattern 16, and the connection conductor 17 are filled. The in-plane conductor 13 or the deformation preventing patterns 15 may be formed by photolithography.

The auxiliary ceramic green sheets are formed by preparing a slurry of a ceramic powder, such as alumina, dispersed in an organic vehicle including an organic binder, an organic solvent, and a plasticizer and then molding the slurry by a doctor blade method or a casting method into a sheet. The auxiliary ceramic green sheets have a sintering temperature, for example, of about 1,400° C. to about 1,600° C. and do not substantially sinter at the sintering temperature of the ceramic green sheets for a substrate.

As well as the in-plane conductor 13 or the deformation preventing patterns 15, the conductive paste is provided on appropriate portions of the ceramic green sheets for a substrate and the auxiliary ceramic green sheets to form the terminal electrodes 18a and 18b on the main surfaces 10a and 10b of the ceramic multilayer substrate 10.

Then, a plurality of ceramic green sheets for a substrate is stacked in appropriate order between auxiliary ceramic green sheets and is bonded, for example, by isostatic pressing to form a green composite laminate. Portions of the auxiliary ceramic green sheets enter the cavity and are arranged to cover the bottom of the cavity. Then, the green composite laminate is fired at a temperature less than the firing temperature of the auxiliary ceramic green sheets, for example, at about 800° C. to about 1,050° C. Then, in the fired composite laminate, porous auxiliary layers formed after organic components volatilize from the auxiliary ceramic green sheets are removed, for example, by sand blasting, wet blasting, or ultrasonic vibration. The ceramic multilayer substrate 10 having the cavity 12 is obtained after removal of the auxiliary layers.

In general, the conductive paste including Au or Cu as a main component has a starting temperature of sintering less than that of the ceramic green sheets for a substrate that are made of a low temperature co-fired ceramic material. Furthermore, the conductive paste finishes sintering faster than the ceramic green sheets for a substrate. The deformation preventing patterns 15 are therefore sintered faster than the ceramic green sheets for a substrate that form the cavity surrounding portion 11b. Thus, the deformation preventing patterns 15 uniformly restrains the ceramic green sheets for a substrate during firing whereby the deformation of the ceramic green sheets for a substrate that form the cavity surrounding portion 11b is prevented. In other words, at the cavity surrounding portion, the firing shrinkage behavior of the conductor pattern defining a deformation preventing pattern predominates over the firing shrinkage behavior of the ceramic green sheets. This prevents non-uniform deformation of the main body 11 of the ceramic multilayer substrate 10, particularly the cavity surrounding portion 11b.

While a non-shrink method using the auxiliary layers is described above, a common method for manufacturing a ceramic multilayer substrate may be used without the auxiliary layers. The non-shrink method, however, more effectively prevents the deformation of the cavity surrounding portion because of its synergistic effect with the use of the deformation preventing pattern.

Second Preferred Embodiment

A ceramic multilayer substrate 20 according to a second preferred embodiment will be described below with reference to FIG. 6.

The ceramic multilayer substrate 20 has substantially the same inner structure as the ceramic multilayer substrate 10 according to the first preferred embodiment.

Figure 6:
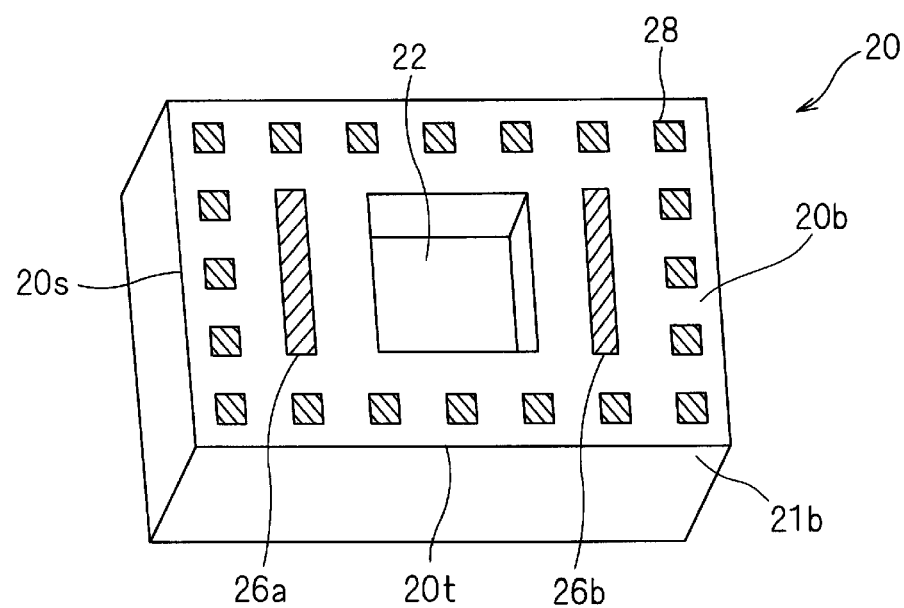
FIG. 6 is an outside drawing of a ceramic multilayer substrate according to another preferred embodiment of the present invention.

As illustrated in FIG. 6, the ceramic multilayer substrate 20 differs from the ceramic multilayer substrate 10 according to the first preferred embodiment in that, in addition to terminal electrodes 28, surface patterns 26a and 26b are provided on a main surface 20b on a cavity 22 side and that the cavity 22 has a substantially square opening and the main surface 20b of the ceramic multilayer substrate 20 is substantially rectangular and has long sides and short sides.

When a plurality of terminal electrodes 28 are arranged in a line on the periphery of the main surface 20b, there is space between the opening and short sides 20s (in a direction of long sides 20t) on the main surface 20b of the ceramic multilayer substrate 20. Thus, the surface patterns 26a and 26b having a greater area than other conductor patterns (in this case, terminal electrodes 28) and being parallel to the short sides 20s are arranged along the cavity 12. In other words, the surface patterns 26a and 26b are substantially rectangular and have long sides that are substantially perpendicular to the long sides 20t. The surface patterns 26a and 26b are formed simultaneously with the terminal electrodes 28 using substantially the same material as a conductor pattern, such as the terminal electrodes 28 or the in-plane conductor.

As in this preferred embodiment, when the ceramic multilayer substrate is anisotropic like a rectangular parallelepiped rather than isotropic, the cavity surrounding portion is more likely to deform. Specifically, in this preferred embodiment, firing shrinkage is larger along the long sides 20t of the ceramic multilayer substrate. Thus, the substantially rectangular surface patterns 26a and 26b having an area greater than the terminal electrodes and having long sides that are substantially perpendicular to the long sides 20t are provided symmetrically with respect to the opening between the opening and the short sides. The surface patterns 26a and 26b more effectively prevent the deformation of a cavity surrounding portion 21b.

The surface patterns 26a and 26b may be partially provided around the cavity 22 on the main surface 20b of the ceramic multilayer substrate 20. The surface patterns 26a and 26b can further enhance grounding when they are connected to a deformation preventing pattern having a ground potential which is provided within the cavity surrounding portion 21b as described in the first preferred embodiment (in particular, a plurality of deformation preventing patterns connected to each other via an interlayer connection conductor pattern).

Third Preferred Embodiment

Figure 7A:
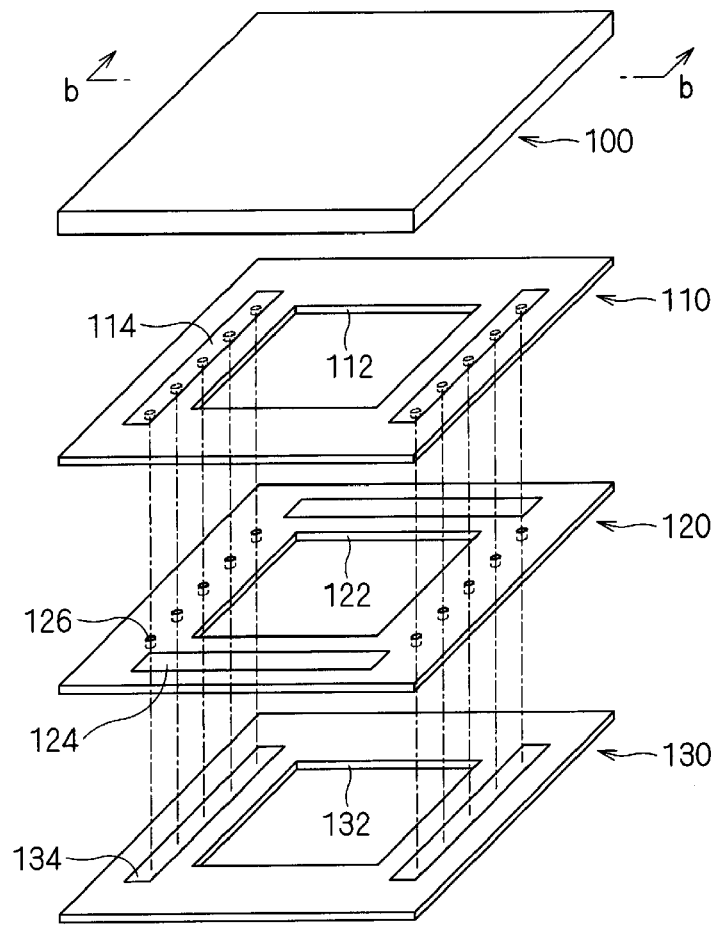
FIG. 7A is an exploded perspective view and FIG. 7B is an assembly cross-sectional view of a ceramic multilayer substrate according to another preferred embodiment of the present invention.
Figure 7B:
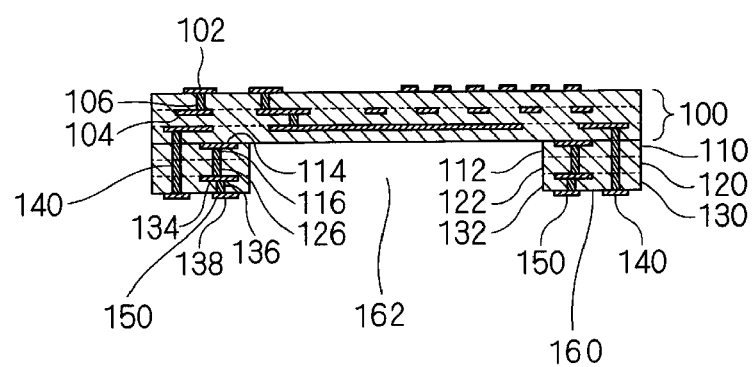

FIG. 7A is an exploded perspective view of a ceramic multilayer substrate according to a third preferred embodiment. FIG. 7B is an assembly cross-sectional view taken along line b-b of FIG. 7A. In FIG. 7A, a signal line is omitted.

The ceramic multilayer substrate according to the third preferred embodiment includes laminated ceramic layers 110, 120, and 130 disposed on a planar base plate portion 100. The laminated ceramic layers 110, 120, and 130 have openings 112, 122, and 132, which define a cavity 162.

The ceramic layers 110 and 130, which are the first layer and the third layer from the base plate portion 100, include deformation preventing patterns 114 and 134. The deformation preventing patterns 114 and 134 are provided on a pair of sides facing each other across the openings 112 and 132 (left and right sides in FIG. 7A). As illustrated in FIG. 7B, the deformation preventing patterns 114 and 134 are connected to each other via interlayer connection conductor patterns 116 and 126 disposed in the ceramic layers 110 and 120, which are the first layer and the second layer. The third ceramic layer 130 includes a connection conductor 136 between the deformation preventing pattern 134 and a ground terminal electrode 138 exposed at a first main surface 160. Thus, the deformation preventing patterns 114 and 134 and the ground terminal electrode 138 are electrically connected to each other to form ground lines 150.

These ground lines 150 are provided on a first pair of opposing sides of four sides defining a periphery of the cavity 162. Signal lines 140 are disposed outside the ground lines 150 (opposite to the cavity 162) on the first pair of sides. The signal lines 140 are electrically connected to surface electrodes 102 on the base plate portion 100, in-plane conductors 104, and interlayer connection conductor patterns 106. Isolation of the signal lines 140 from a component in the cavity 162 is further improved by the ground lines 150.

The ceramic layer 120, which is the second layer from the base plate portion 100, includes a deformation preventing pattern 124 arranged on two sides of the opening 122 on which no ground line 150 is provided, among four sides defining a periphery of the opening 122. The deformation preventing pattern 124 is a floating pattern and is not connected to the ground lines or the signal lines.

The deformation preventing pattern 114 in the first layer, the deformation preventing pattern 134 in the third layer, and the deformation preventing pattern 124 in the second layer are arranged to surround the entire perimeter of the openings 112, 122, and 132 of the cavity 162, when viewed in the direction normal to the first main surface 160.

Fourth Preferred Embodiment

Figure 8:
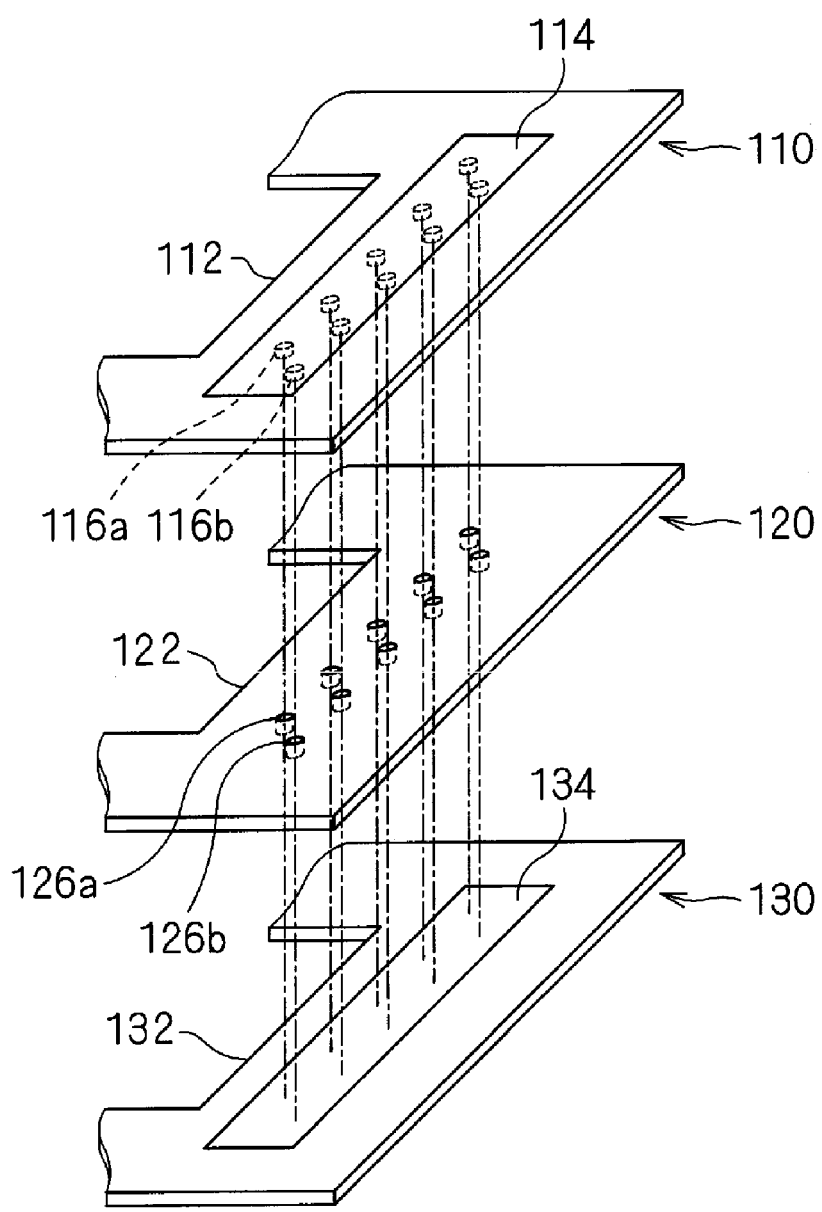
FIG. 8 is an exploded perspective view of a principal portion of a ceramic multilayer substrate according to another preferred embodiment of the present invention.

As illustrated in an exploded perspective view of a principal portion in FIG. 8, in a ceramic multilayer substrate according to a fourth preferred embodiment, as in the third preferred embodiment, ceramic layers 110, 120, and 130 having openings 112, 122, and 132, which define a cavity, are connected to a base plate portion (not shown), and the first ceramic layer 110 and the third ceramic layer 130 include ground patterns 114 and 134. In FIG. 8, a signal line is omitted.

Unlike the third preferred embodiment, in the ceramic multilayer substrate according to fourth preferred embodiment, interlayer connection conductor patterns 116a and 116b and interlayer connection conductor patterns 126a and 126b, which connect between the ground pattern 114 and the ground pattern 134 and thereby define ground lines, are alternately disposed in two lines.

In other words, in the first ceramic layer 110 and the second ceramic layer 120, the interlayer connection conductor patterns 116a and 116b and the interlayer connection conductor patterns 126a and 126b are arranged in two lines that are substantially parallel to sides of the openings 112 and 122. A first interlayer connection conductor patterns 116a and 126a and a second interlayer connection conductor patterns 116a and 126a are alternately disposed along main surfaces of the ceramic layers 110 and 120, when viewed in the direction perpendicular to rows of interlayer connection conductor patterns 116a, 116b; 126a, 126b.

The interlayer connection conductor patterns 116a and 116b and interlayer connection conductor patterns 126a and 126b are arranged in a zigzag or staggered arrangement, whereby the magnetic shielding to a component provided in the cavity is improved. The interlayer connection conductor patterns are not limited to two lines and three or more lines may be provided in a staggered arrangement.

Fifth Preferred Embodiment

Figure 9:
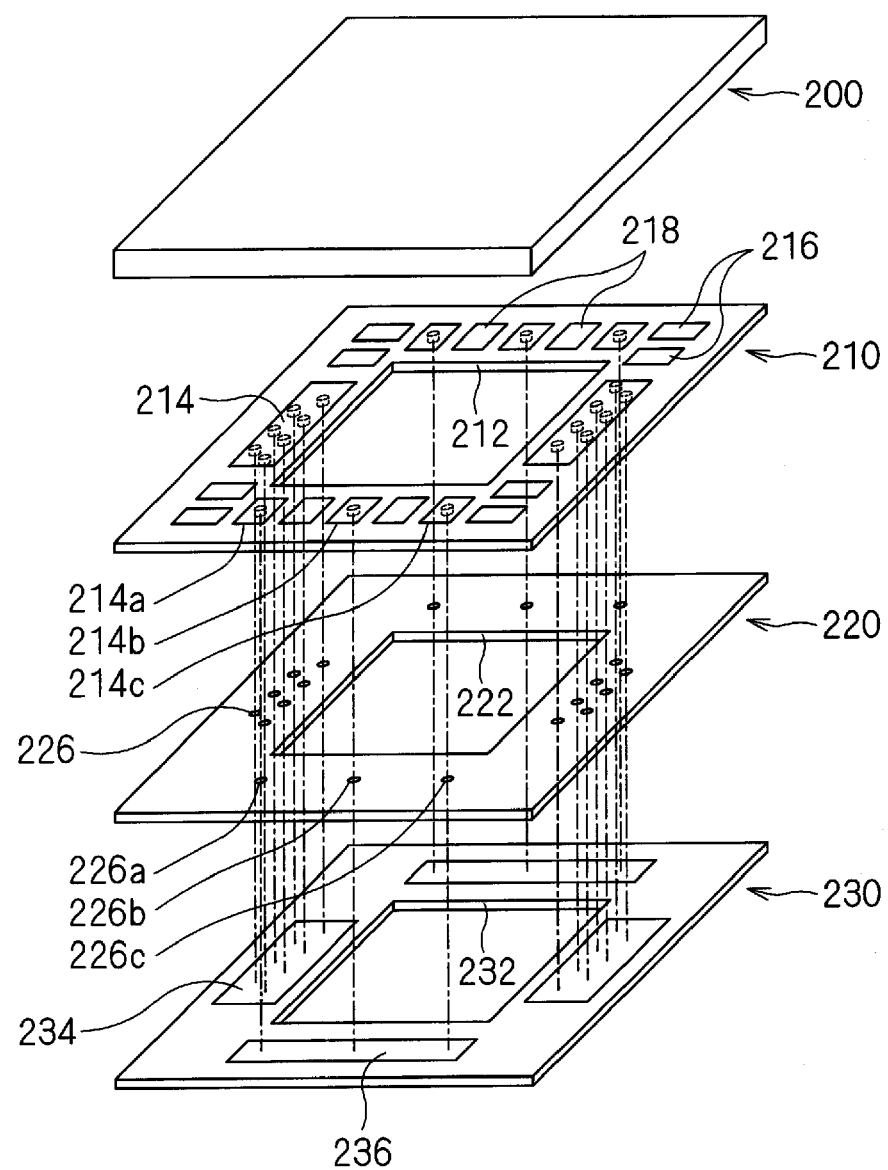
FIG. 9 is an exploded perspective view of a ceramic multilayer substrate according to still another preferred embodiment of the present invention.

As illustrated in an exploded perspective view of FIG. 9, a ceramic multilayer substrate according to a fifth preferred embodiment includes ceramic layers 210, 220, and 230 having openings 212, 222, and 232 which define a cavity. The ceramic layer 210, which is the first layer from a base plate portion 200, includes ground patterns 214, 214a, 214b, and 214c, which define ground lines, and signal patterns 216 and 218, which define signal lines. The ground patterns 214, 214a, 214b, and 214c and the signal patterns 216 and 218 are arranged along the entire perimeter of the opening 212. In FIG. 9, a signal line is omitted.

In the second ceramic layer 220, interlayer connection conductor patterns 226, 226a, 226b, and 226c, which define ground lines, are arranged along the four sides of the opening 212.

In the third ceramic layer 230, ground patterns 234 and 236 are arranged along the entire perimeter of the opening 232.

As shown in the first ceramic layer 210, both of the ground patterns 214, 214a, 214b, and 214c and the signal patterns 216 and 218 may be arranged on the same layer. Both of the ground patterns 214, 214a, 214b, and 214c and the signal patterns 216 and 218 define deformation preventing patterns. When both patterns are arranged on the same layer, more preferably, a signal pattern is arranged between ground patterns, as in the ground pattern 214a, 214b, and 214c and the signal pattern 218. This is because the isolation of the signal pattern is improved.

Preferably, in each ceramic layer 210, 220, and 230, either the ground patterns 214, 214a, 214b, and 214c and 234 and 236, which define ground lines, or interlayer connection conductor patterns 226, 226a, 226b, and 226c, which define ground lines, or both of them are arranged along each side of the openings 212, 222, and 232. This is because the magnetic shielding to a component provided in the cavity is improved.

The ground pattern may be configured according to the degree of deformation of the cavity and may have a variable size. Specifically, the ground patterns may have different sizes for each of the ceramic layers, as in the ground patterns 214 and 234, or 214a, 214b, and 214c and 236 or may have different sizes in each individual ceramic layer, as in the ground patterns 214, 214a, 214b, and 214c.

In the ceramic multilayer substrate described above, a deformation preventing pattern or a surface pattern prevents the deformation of the main body of the ceramic multilayer substrate, particularly warp or waviness of a cavity surrounding portion. This stabilizes the mounting of a component on the ceramic multilayer substrate and increases the connection reliability of the component. Furthermore, the mounting of the ceramic multilayer substrate itself and the connection reliability thereof are also improved.

Furthermore, a specific process for forming an interposing layer, a stress relieving pad, or a pattern for retaining the shape (hereinafter referred to as "interposing layer") according to a related art is not required. Thus, a ceramic multilayer substrate can be produced at low cost.

In addition, a ceramic multilayer substrate without the interposing layer has a reduced thickness. Furthermore, in the absence of the interposing layer, a deformation preventing pattern or an interlayer connection conductor pattern can be formed by the same process as an in-plane conductor or a via hole conductor. Thus, a circuit is also easily formed within a cavity surrounding portion.

Furthermore, a deformation preventing pattern can have a ground potential to enhance grounding. The grounding enhancement improves characteristics, such as high frequency characteristics.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A ceramic multilayer substrate, comprising:
a plurality of ceramic layers laminated together; and
at least one conductor pattern disposed on at least one of the plurality of ceramic layers; wherein the ceramic multilayer substrate has a cavity in at least a first main surface;

at least one of the plurality of ceramic layers having an opening defining the cavity includes a deformation preventing pattern, the deformation preventing pattern being arranged to surround substantially an entire perimeter of the opening when viewed in a direction that is substantially perpendicular to the first main surface, the deformation preventing pattern being made of the same material as the conductor pattern; and a main surface of the deformation preventing pattern is arranged in a plane that is substantially parallel to a plane in which the first main surface of the ceramic multilayer substrate is arranged.

2. The ceramic multilayer substrate according to claim 1, wherein the deformation preventing pattern comprises an annular pattern surrounding substantially the entire perimeter of the opening.

3. The ceramic multilayer substrate according to claim 1, wherein the deformation preventing pattern comprises a partitioned pattern in which a plurality of pattern elements is arranged at intervals on the at least one of the ceramic layers having the opening, so as to surround substantially the entire perimeter of the opening.

4. The ceramic multilayer substrate according to claim 1, wherein the opening is substantially rectangular; and the deformation preventing pattern comprises a belt-like pattern on the at least one of the ceramic layers having the opening, the belt-like pattern extending along at least one side of the opening.

5. The ceramic multilayer substrate according to claim 1, wherein the opening of the cavity is substantially square;

the first main surface is substantially rectangular and includes long sides and short sides;

the first main surface comprises a conductor pattern other than the deformation preventing pattern and the at least one deformation preventing pattern, each disposed between the opening of the cavity and the short sides of the first main surface; and the at least one deformation preventing pattern has an area greater than the conductor pattern other than the deformation preventing pattern.

6. The ceramic multilayer substrate according to claim 1, wherein the deformation preventing pattern is disposed on the first main surface.

7. The ceramic multilayer substrate according to claim 1, further comprising:

a plurality of the deformation preventing patterns disposed on each main surface of the plurality of ceramic layers having the opening; and an interlayer connection conductor pattern made of the same material as the conductor pattern, the interlayer connection conductor pattern passing through the ceramic layers and being connected to the plurality of the deformation preventing patterns.

8. The ceramic multilayer substrate according to claim 7, further comprising:

a plurality of the interlayer connection conductor patterns; wherein the plurality of interlayer connection conductor patterns is alternately disposed in at least two substantially parallel lines when viewed in the direction that is substantially perpendicular to the first main surface.

9. The ceramic multilayer substrate according to claim 1, wherein the deformation preventing pattern comprises a ground pattern electrically connected to a portion having a ground potential in the conductor pattern.

10. The ceramic multilayer substrate according to claim 1, further comprising a terminal for connecting the ceramic multilayer substrate to a circuit board, the terminal being disposed on the first main surface.

11. The ceramic multilayer substrate according to claim 10, further comprising:

a first surface mountable device mounted in the cavity in the first main surface; and a second surface mountable device mounted on a second main surface opposite to the first main surface.

12. The ceramic multilayer substrate according to claim 1, wherein a surface pattern is disposed on the first main surface.

13. The ceramic multilayer substrate according to claim 1, wherein the plurality of ceramic layers are made of a low temperature co-fired ceramic material; and the conductor pattern and the deformation preventing pattern are made of a material including at least one of silver and copper as a main component.

* * * * *